(12) United States Patent
Hung et al.

(10) Patent No.: US 9,279,853 B2
(45) Date of Patent: Mar. 8, 2016

(54) TEST PROBE CARD STRUCTURE

(71) Applicant: HERMES-EPITEK CORP., Taipei (TW)

(72) Inventors: Chien-Yao Hung, Hsinchu (TW); Chih-Yao Chen, Hsinchu (TW)

(73) Assignee: Hermes-Epitek Corp., Taipei (TW)

( * ) Notice: Subject to any disclaimer, the term of this patent is extended or adjusted under 35 U.S.C. 154(b) by 7 days.

(21) Appl. No.: 14/446,628

(22) Filed: Jul. 30, 2014

(65) Prior Publication Data

US 2014/0340109 A1    Nov. 20, 2014

Related U.S. Application Data

(63) Continuation-in-part of application No. 13/115,148, filed on May 25, 2011, now Pat. No. 8,829,936.

(30) Foreign Application Priority Data

Aug. 31, 2010    (TW) .............................. 099129378 A

(51) Int. Cl.
*G01R 1/04*    (2006.01)
*G01R 31/28*    (2006.01)

(52) U.S. Cl.
CPC ........ *G01R 31/2887* (2013.01); *G01R 31/2889* (2013.01)

(58) Field of Classification Search
CPC .. G01R 3/00; G01R 1/07378; G01R 1/07342; G01R 31/2889; G01R 1/07314; G01R 31/2886; H01L 2924/00; H01L 2924/14; H05K 3/326; Y10T 29/49155; Y10T 29/49147; Y10T 29/49124
See application file for complete search history.

(56) References Cited

U.S. PATENT DOCUMENTS

| | | | | |
|---|---|---|---|---|
| 2002/0109514 | A1* | 8/2002 | Brandorff .......... | G01R 1/07378 324/754.07 |
| 2002/0145437 | A1* | 10/2002 | Sporck ............... | G01R 1/07342 324/754.07 |
| 2010/0164518 | A1* | 7/2010 | Yamada ............. | G01R 1/07314 324/756.03 |

* cited by examiner

*Primary Examiner* — Alesa Allgood
(74) *Attorney, Agent, or Firm* — Rosenberg, Klein & Lee

(57) ABSTRACT

A test probe card structure includes a probe card and a connection circuit common plate. The probe card includes a probe substrate, A test circuit board is disposed between the probe substrate and the connection circuit common plate, The test circuit board has a lest circuit connection section attached to and electrically connected with a common circuit adaptation section of the connection circuit common plate. A circuit extension section is formed around the connection circuit common plate, which is all-channel electrically connectable between a tester and the teat circuit connection section. The connection circuit common plate serves to provide an all-channel test circuit convergence connection ability for the test circuit board so as to greatly minify the size of the test circuit board and lower the manufacturing cost of the probe card.

21 Claims, 4 Drawing Sheets

TEST PROBE CARD STRUCTURE

CROSS-REFERENCE TO RELATED APPLICATION

This application is a continuation-in-part application of U.S. patent application Ser. No. 13/115,148, entitled "Probe Card Structure Adaptable to Different Test Apparatuses of Different Specifications", filed on May 25, 2011, now pending.

BACKGROUND OF THE INVENTION

1. Field of the Invention

The present invention relates generally to an improved test probe card structure, and more particularly to a probe card structure for testing integrated circuits. The probe card structure includes a connection circuit common plate connected between a test circuit board and a tester, whereby the test circuit board can be minified to lower the manufacturing cost of the probe card.

2. Description of the Related Art

After processed and formed and before packaged, the wafer of an integrated circuit needs to go through a chip probe (CP) process for testing the electrical functions of the chips of the wafer in every section so as to judge whether the quality of the chips in every section meets the requirement. Accordingly, the chips with poor electrical functions can be previously screened out without being packaged. In this case, the manufacturing cost can be lowered.

In the chip probe process, the wafer to be tested is placed on a tester for testing the integrated circuit. A probe card is installed on a test end of the tester. The probes of the probe card can precisely contact the pads or bumps on the surface of the wafer. The tester is composed of a computer operation system and a programmable signal generator and is program-writable. According to the differences between the circuit layouts of the wafer, different test programs are loaded into the tester. The tester transmits signals to the wafer through the probes of the probe card and receives the electronic feedback signals to show the wafer maps of the good products and defective products on the screen of the tester. Then the tester can automatically analyze and judge whether the functions of the chips are normal or abnormal.

The circuit layout of the chips of the wafer is designed according to the electrical functions of the chips to be achieved. Therefore, the chips can provide the electrical functions by means of the circuit layout. Each wafer necessitates a specific probe card and tester in adaptation to the electrical functions of chips of the wafer for successfully performing the test. Please refer to FIG. 1. A conventional probe card has a probe substrate 2a and a test circuit board 1a. The probe substrate 2a can be made of ceramic material and has a strength sufficient to support multiple probes 21a to abut against the wafer. In accordance with the electrical functions, the test circuit board 1a is divided into a substrate circuit connection section 11a directed to and electrically connected with the probe substrate 2a and a circuit extension section 13a formed around and electrically connected with the test circuit board 1a for electrically connecting with the tester. The test circuit board 1a has a test circuit 12a for electrically connecting with the substrate circuit connection section 11a and the circuit extension section 13a, in general, the bottom face of the substrate circuit connection section 11a of the test circuit board 1a is attached to the top face of the probe substrate 2a, whereby the test circuit 12a of the test circuit board 1a can be electrically connected to the probes 21a via the internal leads 22a of the probe substrate 2a. The circuit layout of the test circuit 12a is designed according to the electrical functions of the wafer to be tested so as to meet the electrical functions of the wafer. In other words, the circuit layout of the test circuit 12a in the probe card must be varied with the circuit layout of the wafer to be tested. Therefore, for testing different wafers with different circuit layouts and different electrical functions, the test circuit 12a of the probe card must be designed with a specific circuit layout, which cannot be commonly applied to other wafers with different circuit layouts.

The number of the test channels of the tester not only decides the test efficiency of the tester, but also decides the size and specification of the end of the tester for installing the test circuit board of the probe card. For example, the common testers on the market can be classified into 256-channel tester and 512-channel tester. The test capacity of the 512-channel tester is much higher than that of the 256-channel tester. Moreover, the specification of the test circuit board connectable to the 512-channel tester is larger than that of the test circuit board connectable to the 256-channel tester. Therefore, under the same technical condition and support, along with the increase of the required test capacity, there is inevitably a trend to manufacture the tester with a larger end for connecting with the test circuit board.

On the other hand, along with the continuous advance of the semiconductor techniques, the chips of the wafer have become smaller and smaller and the distribution density of the chips has become higher and higher. As a result, the number and arrangement density of the probes 21a of the probe card are inevitably increased. The test circuit board 1a of the conventional probe card has a circuit extension section 13a meeting the specification of the end of the tester, which is connectable with the test circuit board. The internal test circuit 12a is connected between the circuit extension section 13a and the substrate circuit connection section 11a to converge a large distribution range (size) to a small distribution range in adaptation to the electrical connection of top face of the probe substrate 2a. The circuit extension section 13a of the 256-channel probe card must meet the size or specification of the test circuit board connection end of the 256-channel tester for connection therewith and application thereto. Similarly, the circuit extension section 13a of the 512-channel probe card must meet the size or specification of the test circuit board connection end of the 512-channel tester. In addition, through the electrical connection of the test circuit 12a, the larger distribution range of the test circuit board connection end of the tester can be converged to the smaller size of the substrate circuit connection section 11a of the test circuit board 1a of the probe card. Then the circuit extension section 13a is electrically connected to the probes 21a via the probe substrate 2a.

The test circuit 12a of the probe card has multiple outer connection terminals 121a extending to the top face of the circuit extension section 13a for electrically connecting with the test circuit board connection end of the tester. The circuit layout and number of the test circuit 12a, the substrate circuit connection section 11a, and the outer connection terminals 121a are varied with the change of the wafer to be tested. For example, in the case that the test circuit board connection end of the tester has 256 test terminals, the circuit layout of the outer connection terminals 121a of the probe card is changed and the number of the outer connection terminals 121a can be 256 or less than 256. In the case that the number of the outer connection terminals 121a of the probe card is equal to the total number of the test terminals of the test circuit board connection end of the tester, this means the circuit layout of the test circuit board 1a of the probe card is applied to all the test channels, (for example, 256 or 512 test channels) of the tester. In the case that the number of the outer connection terminals 121a of the probe card is less than the total number of the test terminals of the tester, this means the circuit layout of the test circuit board 1a of the probe card is only applied some of the test channels of the tester.

Therefore, the circuit layout of the test circuit 12a of the probe card is very complicated and the circuit layout of the test circuit 12a of the probe card must be specifically designed in adaptation to the wafer to be tested. Therefore, the total manufacturing cost of the probe card is always very high. The test circuit board 1a cannot be commonly applied to different wafers or products to test the same. Moreover, in order to adapt the test circuit board 1a of the probe card to the specification of the circuit board connection end of a different tester, the volume of the test circuit board 1a cannot be minified. This means that the test circuit board 1a of the probe card must be specifically manufactured in accordance with the specification of the tester and it is impossible to minify the size of the test circuit board 1a to lower the manufacturing cost.

SUMMARY OF THE INVENTION

It is therefore a primary object of the present invention to provide an improved test probe card structure including a connection circuit common plate disposed between the test circuit board of the probe card and the test circuit connection end of the tester. The connection circuit common plate is applicable to all specifications of testers. An all-channel convergence connection circuit is built in the connection circuit common plate for converging (minifying) the distribution range of all the test channels. The test circuit board of every probe card is manufactured on the basis of the converged size. The test circuit board is varied with the change of the circuit layout of different wafer products. Therefore, the manufacturing size of the test circuit board of every different probe card can be greatly minified so as to greatly lower the total manufacturing cost of every different probe card.

To achieve the above and other objects, the test probe card structure of the present invention includes a probe card and a connection circuit common plate. The probe card includes a test circuit board and a probe substrate. Multiple probes are disposed on the probe substrate corresponding to the product (wafer) to be tested. The test probe card structure is characterized in that the test circuit board is disposed between the probe substrate and the connection circuit common plate. The test circuit board has a substrate circuit connection section attached to and electrically connected with the probe substrate and a test circuit connection section attached to and electrically connected with the connection circuit common plate, The connection circuit common plate has a circuit extension section externally connectable to an external tester. An all-channel convergence connection circuit is disposed between the circuit extension section and the connection circuit common plate corresponding to the test circuit connection section for converging the converging and minifying the distribution range of all the test channels. Accordingly, the connection circuit common plate can provide a distribution range convergence (minifying) effect for all the test channels. In this case, the test circuit board designed in accordance with different wafers or products can be manufactured with a smaller volume (size) on the basis of the converged distribution range of the test channels. In this case, the manufacturing cost of the probe card for testing the different wafers or products can be greatly lowered.

Still to achieve the above and other objects, the test probe card structure of the present invention includes a probe card and a connection circuit common plate. The probe card includes a test circuit board and a probe substrate. Multiple probes are disposed on the probe substrate. The test probe card structure is characterized in that the test circuit board is disposed between the probe substrate and the connection circuit common plate. The test circuit board has a substrate circuit connection section attached to and electrically connected with the probe substrate and a test circuit connection section electrically connected with the substrate circuit connection section. The connection circuit common plate has a common circuit adaptation section attached to and electrically connected with the test circuit connection section of the test circuit board and a circuit extension section externally connectable to an external tester. The circuit extension section is formed around and electrically connected with the common circuit adaptation.

In the above test probe card structure, multiple leads are disposed in the probe substrate and electrically connected with the probes in accordance with the circuit layout of the product (wafer) to be tested. The leads have multiple conductive contacts in a position where the probe substrate attaches to the substrate circuit connection section of the test circuit board.

The substrate circuit connection section is electrically connected to a test circuit in the test circuit board. The test circuit has multiple test contacts to the test circuit connection section. Multiple substrate circuit contacts with a number equal to that of the test contacts are disposed on the substrate circuit connection section.

An all-channel convergence connection circuit is disposed between the common circuit adaptation section and circuit extension section of the connection circuit common plate corresponding to all the test channels of the tester. The all-channel convergence connection circuit has multiple outer connection terminals positioned where the circuit extension section of the connection circuit common plate is positioned for externally connecting with all the test channels of the tester and multiple inner connection terminals positioned where the common circuit adaptation section is positioned for all-channel attaching to and contacting the test contacts. The distribution of the all-channel convergence connection circuit is gradually converged from the circuit extension section to the common circuit adaptation section.

Accordingly, the connection circuit common plate serves to provide an all-channel circuit distribution range convergence connection ability for the test circuit hoard of the probe card. In this case, between the probe card and the tester with a different number of test channels for testing different products (such as chips), the connection circuit common plate can previously converge (minify) the distribution range of all the test channels. In this case, the test circuit board of the probe card can be manufactured on the basis of the minified size. This can effectively save the cost for remanufacturing or purchasing a test circuit board for the product to be tested.

The present invention can be best understood through the following description and accompanying drawings, wherein:

DETAILED DESCRIPTION OF THE PREFERRED EMBODIMENTS

Figure 1:
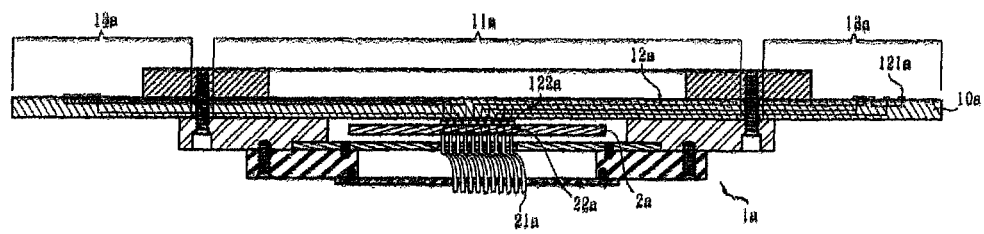
FIG. 1 is a sectional view of a conventional probe card.
Figure 2:
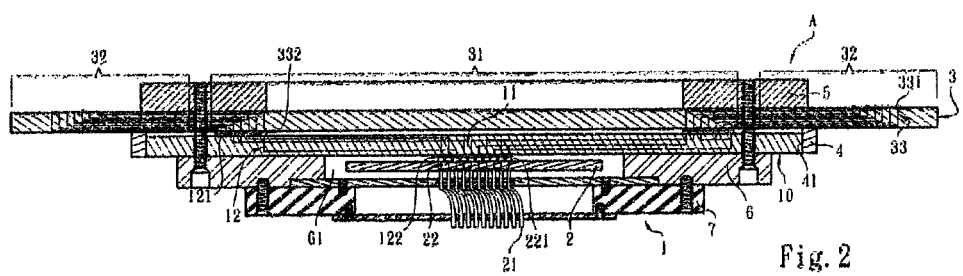
FIG. 2 is a sectional view of a preferred embodiment of the present invention.
Figure 3:
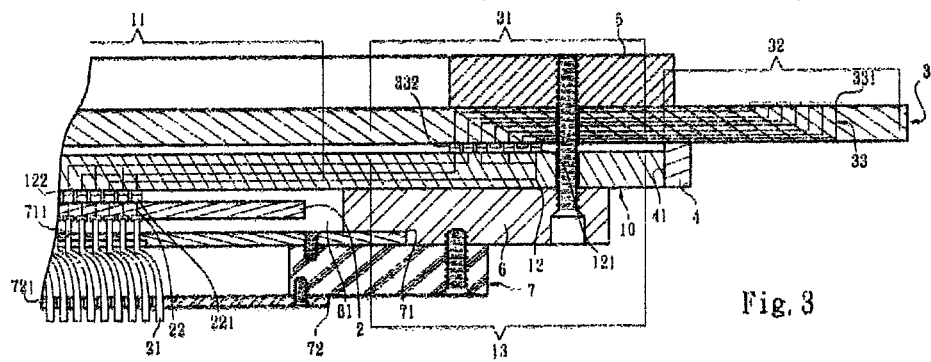
FIG. 3 is an enlarged view of a part of FIG. 2.
Figure 4:
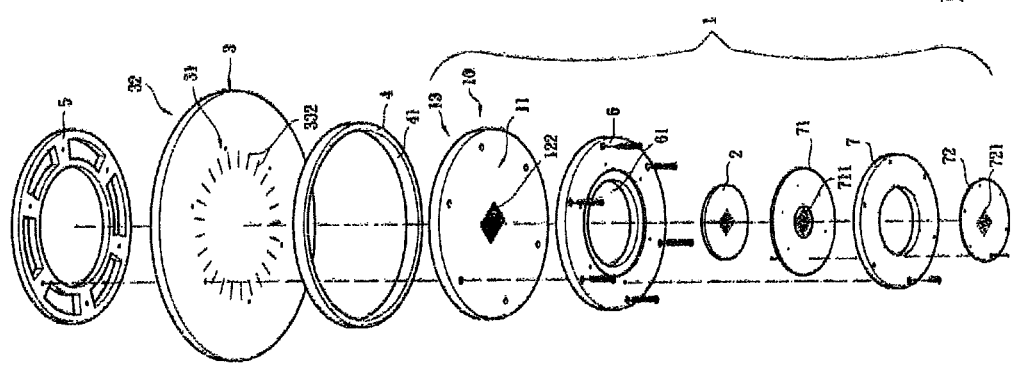
FIG. 4 is a perspective exploded view of the first embodiment of the present invention.

Please refer to FIGS. 2 to 4, which show a first embodiment of the test probe card structure of the present invention. According to the first embodiment, the test probe card structure of the present invention includes a probe card 1 and a connection circuit common plate 3. The probe card 1 at least includes a test circuit board 10 and a probe substrate 2 Multiple probes 21 are electrically connected with and disposed on the probe substrate 2. in this embodiment, the test circuit board 10 is disposed between the probe substrate 2 and the connection circuit common plate 3. The test circuit board 10 has a substrate circuit connection section 11 and a test circuit connection section 13. The substrate circuit connection section 11 is attachable to the probe substrate 2 to electrically connect therewith. The connection circuit common plate 3 has a common circuit adaptation section 31 and a circuit extension section 32. The common circuit adaptation section 31 is attachable to the test circuit connection section 13 to electrically connect therewith. The circuit extension section 32 is formed around the common circuit adaptation section 31 and electrically connected therewith, The circuit extension section 32 is electrically connect able to all the test channels of a tester.

In practice, multiple leads 22 are disposed in the probe substrate 2 and electrically connected with the probes 21. The leads 22 have multiple conductive contacts 221 on the top face of the probe substrate 2 in attachment to the substrate circuit connection section 11. The probes 21 are positioned under the bottom face of the probe substrate 2 opposite to the conductive contacts 221. A test circuit 12 is disposed in the test circuit board 10. The test circuit 12 has multiple substrate circuit contacts 122 positioned where the substrate circuit connection section 11 is positioned for contacting the conductive contacts 221 on the top face of the probe substrate 2. The test circuit 12 of the test circuit board 10 has multiple test contacts 121 positioned where the test circuit connection section 13 is positioned corresponding to the common circuit adaptation section 31 of the connection circuit common plate 3. The test contacts 121 are arranged around the substrate circuit contacts 122. The distribution range (position size) of the test contacts 121 is converged to the distribution range (position size) of the substrate circuit contacts 122 and the test contacts 121 are electrically connected to the substrate circuit contacts 122. An all-channel convergence connection circuit 33 is commonly disposed in the common circuit adaptation section 31 and the circuit extension section 32. The all-channel convergence connection circuit 33 has multiple outer connection terminals 331 positioned where the circuit extension section 32 is positioned for electrically connecting with the tester. The all-channel convergence connection circuit 33 further has multiple inner connection terminals 332 positioned where the common circuit adaptation section 31 is positioned for contacting the test contacts 121 of the test circuit board 10.

It should be noted that the term "all-channel" of the all-channel convergence connection circuit 33 is such defined that the number of the outer connection terminals 331 of the all-channel convergence connection circuit 33 is equal to the number of all the test channels (or terminals) of the tester. That is, the circuit layout of the all-channel convergence connection circuit 33 of the connection circuit common plate 3 is correspondingly applied to all the test channels, (for example, 256 or 512 channels) of the tester. In this embodiment, a tester with 512 test channels is taken as an example. The connection circuit common plate 3 is connected with the probe card 1 composed of the test circuit board 10 and the probe substrate 2 with 512 test channels. The outer connection terminals 331 of the all-channel convergence connection circuit 33 of the connection circuit common plate 3 are all-channel correspondingly electrically connected with the tester with 512 test channels, In addition, the inner connection terminals 332 of the all-channel convergence connection circuit 33 are correspondingly electrically connected with the test circuit board 10 of the probe card with 512 or less then 512 test channels. As shown in the drawings, a correction ring 4 is disposed under the bottom face of the connection circuit common plate 3. The correction ring 4 has a hollow annular form to define an insertion socket 41. The test circuit board 10 is fixedly received in the insertion socket 41 of the correction ring 4. An outer reinforcement member 5 is disposed on the top face of the connection circuit common plate 3 opposite to the test circuit board 10. An inner reinforcement member 6 is disposed under the bottom face of the test circuit board 10 opposite to the connection circuit common plate 3. The inner reinforcement member 6 has an annular form with a hollow center. Therefore, the inner reinforcement member 6 has a central passage 61 for receiving the probe substrate 2. The connection circuit common plate 3 and the test circuit board 10 are sandwiched between the outer and inner reinforcement members 5, 6. A probe locating seat 7 is assembled with the inner reinforcement member 6 under the bottom face of the test circuit board 10 opposite to the connection circuit common plate 3. The probe locating seat 7 has an annular form with a hollow center. A top board 71 and a bottom board 72 are respectively disposed on the top face and bottom face of the probe locating seat 7. The top board 71 is formed with multiple locating holes 711 and the bottom board 72 is formed with multiple through holes 721 in communication with the locating holes 711. The top ends of the probes 21 are securely inlaid in the locating holes 711, while the bottom ends of the probes 21 movably extend into the through holes 721.

By means of the above arrangement, it is only necessary to uniformly design and manufacture the all-channel convergence connection circuit 33 in the connection circuit common plate 3 according to all the test channels or circuits of the tester for electrically connecting therewith. In addition, the inner connection terminals 332 of the all-channel convergence connection circuit 33 are laid out within the smaller distribution range of the common circuit adaptation section 31, to which the distribution range of the circuit extension section 32 is converged., In this case, it is only necessary to design the circuit layout of the test circuit connection section 13 and the substrate circuit connection section 11 of the test circuit 12 of the test circuit board 10 within the converged range of the inner connection terminals 332 corresponding to the electrical properties and functions of the product (wafer) to be tested. This can greatly save the material of the outward extending circuit board externally connected to the tester and greatly lower the manufacturing cost of the test circuit board 10. Moreover, the circuit layout range of the internal test circuit 12 of the test circuit board 10 can be shortened to lower the complication in full layout and manufacturing.

Figure 5:
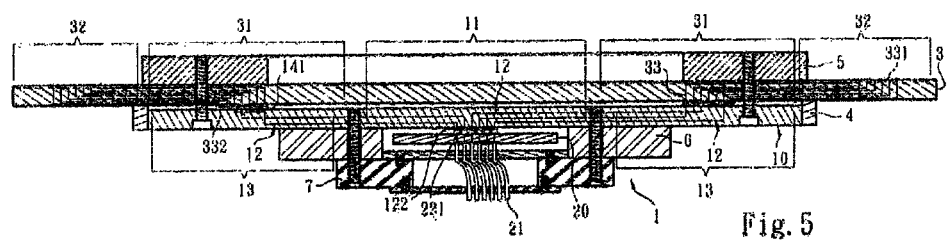
FIG. 5 is a sectional view of a second embodiment of the present invention.
Figure 6:
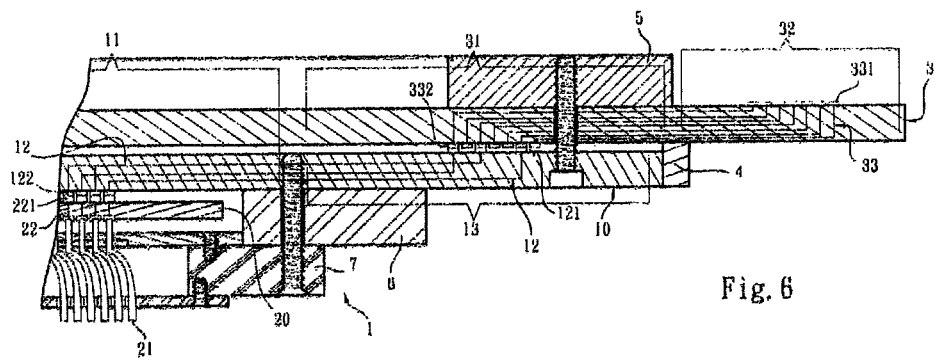
FIG. 6 is an enlarged view of a part of FIG. 5.

In conclusion, the all-channel convergence connection circuit 33 of the connection circuit common plate 3 provides an all-channel circuit convergence connection means between the probe card and the external tester. This not only simplifies the internal circuit structure of the test circuit board 10, but also greatly minifies the required size of the test circuit board 10. Accordingly, the complication of the test circuit board can be apparently reduced and the manufacturing cost of the test circuit board can be greatly lowered to overcome the shortcomings of the conventional technique, Please now refer to FIGS. 5 and 6, which show a second embodiment of the test probe card structure of the present invention. According to the second embodiment, the test probe card structure of the present invention includes a probe card 1 and a connection circuit common plate 3. The probe card 1 at least includes a test circuit board 10 and a probe substrate 20. Multiple probes 21 are disposed on the bottom face of the probe substrate 20. In this embodiment, the test circuit board 10 is disposed between the probe substrate 20 and the connection circuit common plate 3. To speak more specifically, the test circuit board 10 has a substrate circuit connection section 11 and a test circuit connection section 13 formed around the substrate circuit connection section 11 to electrically connect therewith. The substrate circuit connection section 11 is attachable to the probe substrate 20 to electrically connect therewith. The connection circuit common plate 3 has a common circuit adaptation section 31 and a circuit extension section 32 formed around the common circuit adaptation section 31 to electrically connect therewith. The common circuit adaptation section 31 is attachable to the test circuit connection section 13 of the test circuit board 10 to electrically connect therewith. The circuit extension section 32 is externally connectable to all the test channels of a tester.

In practice, a test circuit 12 is disposed in the test circuit board 10, The test circuit 12 has multiple substrate circuit contacts 122 positioned where the substrate circuit connection section 11 is positioned for contacting the conductive contacts 221 of the probe substrate 20. The test circuit connection section 13 of the test circuit board 10 has multiple test contacts 121 electrically connected with the test circuit 12. The all-channel convergence connection circuit 33 has multiple outer connection terminals 331 positioned where the circuit extension section 32 of the connection circuit common plate 3 is positioned. In addition, the all-channel convergence connection circuit 33 further has multiple inner connection terminals 332 positioned where the common circuit adaptation section 31 of the connection circuit common plate 3 is positioned for contacting the test contacts 121 of the test circuit board 10.

In this embodiment, a tester with 512 test channels is taken as an example of large-scale tester and a tester with 256 test channels is taken as an example of small-scale tester. The probe card 1 is such manufactured that the test circuit board 10 and the probe substrate 20 of the probe card 1 have a specification corresponding to the specification (smaller specification) of the tester with 256 test channels. The connection circuit common plate 3 is manufactured with a specification corresponding to the specification (larger specification) of the tester with 512 test channels. In this case, the probe card 1 can be directly mounted on the large-scale tester with 512 test channels by all-channel convergence electrical connection. To speak more specifically, in the above embodiment, by means of the connection circuit common plate 3, the outer connection terminals 331 of the all-channel convergence connection circuit 33 are provided to meet the tester with 512 test channels. Therefore, the probe card can be correspondingly connected to the tester with 512 test channels by all-channel electrical connection. Especially, in the case that the specification of the common circuit adaptation section 31 of the connection circuit common plate 3 is converged to the specification of the test circuit board 10 that just meets the (small-scale) tester with 256 test channels, then the probe substrate (probe card) 1 meeting the 256-channel tester can be directly installed on the connection circuit coupon plate 3. In this case, when the common circuit adaptation section 31 of the connection circuit common plate 3 is attached to the test circuit board 10 of the probe substrate (probe card) 1 commonly applicable to the 256-channel tester, the common circuit adaptation section 31 is right correspondingly electrically connected with the test circuit connection section 13 of the test circuit board 10. By means of the inner connection terminals 332 electrically connected with the all-channel convergence connection circuit 33, the common circuit adaptation section 31 is correspondingly electrically connected to the test contacts 121 of the test circuit board 10 of the (small-scale) probe substrate (probe card) 1 applicable to the 256-channel tester.

According to the above, the connection circuit common plate 3 serves to provide the all-channel (or less) test circuit convergence connection ability for the test circuit board 10 of the probe substrate 1 meeting the specification of 256-channel (small-scale) tester. In this case, through the circuit convergence connection ability of the connection circuit common plate 3, the probe card meeting the specification of 256-channel (small-scale) tester can be connected and applied to the 512-channel (large-scale) tester. Accordingly, as aforesaid, the probe card is applicable to both the small-scale tester and the large-scale tester so that the cost for remanufacturing or purchasing a probe card meeting the specification of the large-scale tester can be saved. Therefore, one single tester of a certain specification can be more widely used to increase the test efficiency. This overcomes the problem of the conventional technique that the probe card meeting the specification of a tester with less test channels cannot be directly installed on the tester with more test channels and the test efficiency is lowered.

The above embodiments are only used to illustrate the present invention, not intended to limit the scope thereof. Many modifications of the above embodiments can be made without departing from the spirit of the present invention.

What is claimed is:

1. A test probe card structure comprising a probe card and a connection circuit common plate, the probe card including a test circuit board and a probe substrate, multiple probes being electrically connected with and disposed on the probe substrate, the test circuit board being disposed between the probe substrate and the connection circuit common plate, the test circuit board having a substrate circuit connection section attached to and electrically connected with the probe substrate and a test circuit connection section attachable to and electrically connectable with the connection circuit common plate, the connection circuit common plate having a circuit extension section externally connectable to an external tester and a common circuit adaptation section electrically connected with the test circuit connection section, the circuit extension section being formed around the common circuit adaptation section and electrically connected therewith, an all-channel convergence connection circuit being formed from the circuit extension section to the common circuit adaptation section, the all-channel convergence connection circuit having a specification meeting the specification of the tester, whereby the circuit distribution range or size of the common circuit adaptation section is smaller than the circuit distribution range or size of the circuit extension section.

2. The test probe card structure as claimed in claim 1, wherein a correction ring is disposed on the connection circuit common plate for receiving the test circuit board.

3. The test probe card structure as claimed in claim 1, wherein a probe locating seat is assembled on the test circuit board in a position opposite to the connection circuit common plate, two faces of the probe locating seat being respectively formed with multiple locating holes and through holes in communication with the locating holes, top ends of the probes being securely inlaid in the locating holes, while bottom ends of the probes movably extending into the through holes.

4. The test probe card structure as claimed in claim 1, wherein a test circuit is disposed in the test circuit board, the test circuit having multiple substrate circuit contacts positioned where the substrate circuit connection section is positioned, the test circuit further having multiple test contacts positioned where the test circuit connection section is positioned for attaching to and contacting the common circuit adaptation section.

5. The test probe card structure as claimed in claim 4, wherein the all-channel convergence connection circuit has multiple outer connection terminals positioned where the circuit extension section is positioned for externally connect ins with the tester and multiple inner connection terminals positioned where the common circuit adaptation section is positioned for attaching to and contacting the test contacts.

6. The test probe card structure as claimed in claim 4, wherein the test contacts are arranged around the substrate circuit contacts.

7. The test probe card structure as claimed in claim 1, wherein multiple leads are disposed in the probe substrate and electrically connected with the probes, the leads having multiple conductive contacts in a position where the probe substrate attaches to the substrate circuit connection section.

8. The test probe card structure as claimed in claim 7, wherein the probes are positioned on the probe substrate in a position opposite to the conductive contacts.

9. The test probe card structure as claimed in claim 7, wherein a correction ring is disposed on the connection circuit common plate for receiving the test circuit board.

10. The test probe card structure as claimed in claim 1, wherein an outer reinforcement member is disposed on the connection circuit common plate in a position opposite to the test circuit board, an inner reinforcement member being disposed on the test circuit board in a position opposite to the connection circuit common plate, the inner reinforcement member having a passage for receiving the probe substrate, whereby the connection circuit common plate and the test circuit board are sandwiched between the outer and inner reinforcement members.

11. The test probe card structure as claimed in claim 10, wherein a probe locating seat is assembled on the test circuit board in a position opposite to the connection circuit common plate, two faces of the probe locating seat being respectively formed with multiple locating holes and through holes in communication with the locating holes, top ends of the probes being securely inlaid in the locating holes, while bottom ends of the probes movably extending into the through holes.

12. A test probe card structure comprising a test circuit board adapted to test channels or circuits of a small-scale tester and a probe substrate, multiple probes being electrically connected with and disposed on the probe substrate, the test circuit board being disposed between the probe substrate and a connection circuit common plate outside the probe card, the test circuit board having a circuit layout meeting the test channels or circuits of the small-scale tester, the test circuit board having a substrate circuit connection section attached to and electrically connected with the probe substrate and a test circuit connection section formed a round and electrically connected with the substrate circuit connection section, the connection circuit common plate having a common circuit adaptation section attached to and electrically connected with the test circuit board and a circuit extension section externally connectable to all the test channels or circuits of a large-scale tester, the circuit extension section of the connection circuit common plate and an all-channel convergence connection circuit being formed around and electrically connected with the common circuit adaptation section.

13. The test probe card structure as claimed in claim 12, wherein a correction ring is disposed on the connection circuit common plate for receiving the test circuit board.

14. The test probe card structure as claimed in claim 12, wherein an outer reinforcement member is disposed on the connection circuit common plate in a position opposite to the test circuit board, an inner reinforcement member being disposed on the test circuit board in a position opposite to the connection circuit common plate, the inner reinforcement member having a passage for receiving the probe substrate, whereby the connection circuit common plate and the test circuit board are sandwiched between the outer and inner reinforcement members.

15. The test probe card structure as claimed in claim 12, wherein a probe locating scat is assembled on the test circuit board in a position opposite to the connection circuit common plate, two faces of the probe locating seat being respectively formed with multiple locating holes and through holes in communication with the locating holes, top ends of the probes being securely inlaid in the locating holes, while bottom ends of the probes movably extending into the through holes.

16. The test probe card structure as claimed in claim 12, wherein a test circuit is disposed in the test circuit board, the test circuit having multiple substrate circuit contacts positioned where the substrate circuit connection section is positioned for attaching to and contacting the conductive contacts, multiple test contacts being disposed on the test circuit connection section of the test circuit board for electrically connecting with the test circuit.

17. The test probe card structure as claimed in claim 16, wherein the all-channel convergence connection circuit has multiple outer connection terminals positioned where the circuit extension section of the connection circuit common plate is positioned for externally connecting with the large-scale tester and multiple inner connection terminals positioned where the common circuit adaptation section is positioned for attaching to and contacting the test contacts.

18. The test probe card structure as claimed in claim 16, wherein the test contacts are arranged around the substrate circuit contacts.

19. The last probe card structure as claimed in claim 12, wherein multiple leads are disposed in the probe substrate and electrically connected with the probes, the leads having multiple conductive contacts in a position where the probe substrate attaches to the substrate circuit connection section.

20. The test probe card structure as claimed in claim 19, wherein the probes are positioned on the probe substrate in a position opposite to the conductive contacts.

21. The test probe card structure as claimed in claim 20, wherein a probe locating seat is assembled on the test circuit board in a position opposite to the connection circuit common plate, two faces of the probe locating seat being respectively formed with multiple locating holes and through holes in communication with the locating holes, top ends of the probes being securely inlaid in the locating holes, while bottom ends of the probes movably extending into the through holes.

* * * * *